US008571631B2

(12) United States Patent
Deimling

(10) Patent No.: US 8,571,631 B2
(45) Date of Patent: Oct. 29, 2013

(54) METHOD FOR CONTRAST-AGENT-FREE ANGIOGRAPHIC IMAGING IN MAGNETIC RESONANCE TOMOGRAPHY

(75) Inventor: Michael Deimling, Moehrendorf (DE)

(73) Assignee: Siemens Aktiengesellschaft, Munich (DE)

( * ) Notice: Subject to any disclaimer, the term of this patent is extended or adjusted under 35 U.S.C. 154(b) by 944 days.

(21) Appl. No.: 12/645,858

(22) Filed: Dec. 23, 2009

(65) Prior Publication Data

US 2010/0160767 A1 Jun. 24, 2010

(30) Foreign Application Priority Data

Dec. 23, 2008 (DE) .......................... 10 2008 062 853

(51) Int. Cl.
*A61B 5/05* (2006.01)
(52) U.S. Cl.
USPC ............................ 600/410; 600/407; 324/306
(58) Field of Classification Search
USPC .................... 324/306; 600/407, 410
See application file for complete search history.

(56) References Cited

U.S. PATENT DOCUMENTS

| 5,204,625 | A | 4/1993 | Cline et al. | |
| 5,221,898 | A * | 6/1993 | Takiguchi et al. | 324/306 |
| 6,493,569 | B2 | 12/2002 | Foo et al. | |
| 6,552,542 | B1 | 4/2003 | Overall | |
| 6,806,709 | B2 | 10/2004 | Markl et al. | |
| 8,154,287 | B2 * | 4/2012 | Edelman et al. | 324/309 |
| 2002/0183612 | A1 | 12/2002 | Deimling | |
| 2004/0162483 | A1 | 8/2004 | Kimura | |
| 2004/0207401 | A1 | 10/2004 | Kirsch | |
| 2007/0080687 | A1 | 4/2007 | Ganter | |
| 2007/0247157 | A1 * | 10/2007 | Haider | 324/318 |
| 2010/0134103 | A1 * | 6/2010 | Edelman et al. | 324/309 |
| 2011/0166436 | A1 * | 7/2011 | Edelman | 600/410 |

OTHER PUBLICATIONS

"Quantitative 2D and 3D Phase Contrast MRI: Optimized Analysis of Blood Flow and Vessel Wall Parameters," Staider et al., Magnetic Resonance in Medicine, vol. 80 (2008) pp. 1218-1231.
"A New Steady-State Imaging Sequence for Simultaneous Acquisition of Two MR Images with Clearly Different Contrasts," Bruder et al., Magnetic Resonance in Medicine, vol. 7 (1988) pp. 35-42.
"Non-Contrast Enhanced Flow-Independent Peripheral MR Angiography with Balanced SSFP." çukur et al., Magnetic Resonance in Medicine, vol. 61 (2009) pp. 1533-1539.
"SSFP Imaging with Synergistic T1-T2-Contract," Deimling et al., SMRM (1994) p. 1206.

* cited by examiner

*Primary Examiner* — Unsu Jung
*Assistant Examiner* — Nasir S Shahrestani
(74) *Attorney, Agent, or Firm* — Schiff Hardin LLP

(57) ABSTRACT

A method for contrast-agent-free non-triggered angiographic imaging in magnetic resonance tomography that includes the steps of (S1) 2D or 3D measurement of a bodily region having a flow of blood, using a flow-insensitive SSFP sequence, (S2) measurement of the same bodily region using a flow-sensitive SSFP sequence, (S3) registration of the measurement results obtained in steps S1 and S2 to one another, (S4) unweighted or self-weighted subtraction of the registered measurement result obtained in step S2 from the registered measurement result obtained in step S1, (S5) execution of a 2D or 3D image correction of the image obtained in step S4 by removing image distortions caused by gradient field inhomogeneities and/or magnetic basic field inhomogeneities, and (S6) representation of the angiogram obtained in step S5 in the form of an MIP or segmented 2D or 3D vessel tree representation.

5 Claims, 6 Drawing Sheets

FIG 9
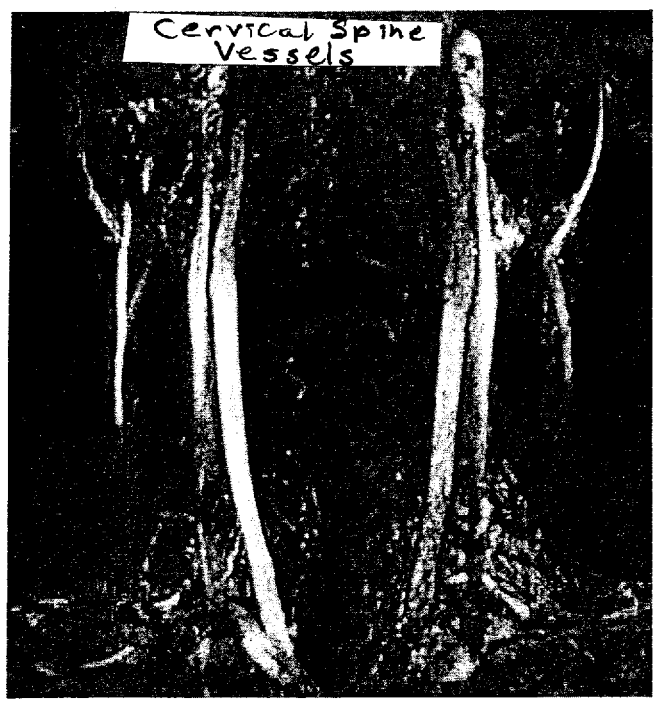
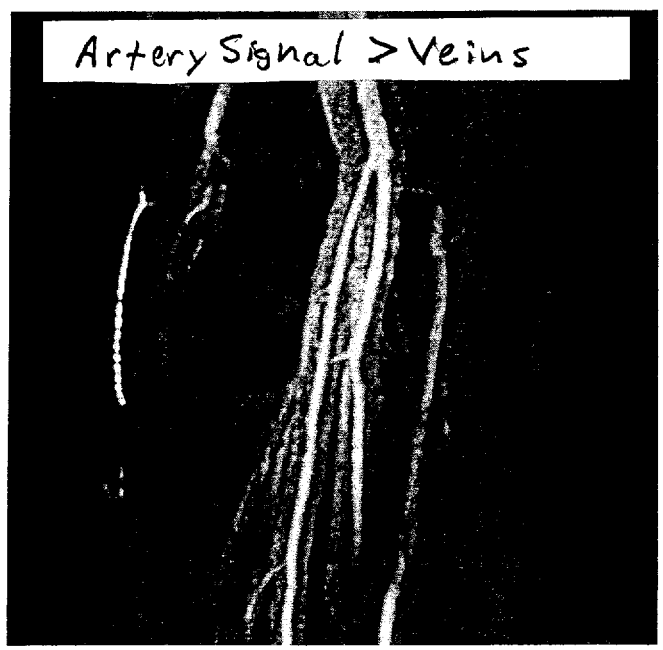

METHOD FOR CONTRAST-AGENT-FREE ANGIOGRAPHIC IMAGING IN MAGNETIC RESONANCE TOMOGRAPHY

BACKGROUND OF THE INVENTION

1. Field of the Invention

The present invention relates in general to magnetic resonance tomography, or MRT as is used in the field of medicine in order to examine patients. In particular, the present invention relates to a method for the magnetic resonance tomographic representation of vessels (angiography) without the use of contrast agent, and without physiological synchronization with the execution of the MR sequence.

2. Description of the Prior Art

The term "angiography" refers in general to the representation of blood vessels (arteries and/or veins) using medical imaging methods (x-ray, CT, MRT). In magnetic resonance angiography (MRA) there are two classical methods that make use of the property of the flow of blood in order to represent the vessels (time of flight methods, or TOF, and phase-contrast angiography, or PC angio). There is also MRA supported by contrast agent, which uses contrast agent that increases spin relaxation in order to obtain a signal-rich representation.

Time of flight MRA exploits the flow of blood into the imaging volume for angiographic representation.

In this technique, the blood flowing in is completely relaxed and emits, as an endogenous (i.e., not supplied to the body) contrast agent, a strong signal. As a consequence of a rapid sequence of RF pulses, the stationary tissue experiences a strong saturation, and ultimately supplies only a small signal contribution. The TOF measurement is preferably carried out in the time domain using a gradient echo sequence. The asymmetrical excitation form of this sequence brings about a comparable cross-magnetization of the inflowing blood in the overall 3D volume. TOF technology is used both as a 2D method and as a 3D method. The 2D version is preferably used in the cervical spine region, because there, due to the high speed of blood flow, the blood is completely exchanged within a repetition time span TR. In this region, it is therefore possible to achieve a very high degree of magnetization for the imaging using a large excitation pulse angle. A disadvantage of the TOF method is its sensitivity to patient movement, in particular in the cervical region.

Another method is phase-contrast angiography method. Like TOF angiography, phase-contrast angiography (PC-angio or PCA) uses the blood flow for the selective representation of the vessels in the MRT.

In TOF, a bipolar gradient is used for first-order flow compensation. Conversely, in PCA a bipolar gradient $G_b$ is used for the coding of the flow speed in order to generate an additional phase proportional to the speed $v_x$:

$$\Delta\Phi_{v_x} = \gamma \cdot G_b \cdot V_x \cdot \tau^2,$$

where $\tau$ is the duration of $G_b$. The complex subtraction of an image that is flow-compensated in the x direction from a flow-sensitive image accordingly results in an image whose pixel vectors have a magnitude and a phase proportional to the speed $v_x$. It follows from this that the stationary spins do not supply any contribution.

Sequences having different phase sensitivity therefore allow, after subtraction, a background-free representation of vessels. A disadvantage of this method is that it can be applied only to one particular speed interval at a time, in order to avoid ambiguities.

In recent years, contrast agent-supported angiography (CE-MRI) has become widely used for almost all bodily regions. It permits both dynamic and static examinations to be made in a very short measurement time. The functioning of contrast agents in MR is based in general on an influencing of some of the parameters $T_1$, $T_2$ that are decisive for the contrast, with the aid of atoms or molecules that have a sufficiently large magnetic moment (e.g. gadolinium $Gd^{3+}$). However, as free ions all these substances are highly toxic, and thus cannot be used in this form. The toxicity (poisonousness) can be reduced by binding these ions in what are known as chelate complexes. However, recently there have been increased reports of (kidney) ailments (Nephrogenic Systemic Fibrosis, or NSF) caused by contrast agents containing gadolinium. Therefore, recently work has been done on methods that do not make use of contrast agent, i.e. that are contrast agent-free.

A method recently developed by Toshiba is called fresh blood imaging (FBI). It essentially makes use of the fact that the $T_2$ relaxation time of blood is much longer than that of the stationary tissue that surrounds the blood vessel system. The FBI imaging sequence is based in principle on a (EKG- and respiration-triggered) Toshiba-specific FASE (Fast Advanced Spin Echo) sequence.

Another method, developed by Siemens, is known as SPACE, and also uses EKG triggering. SPACE is a variant of the 3D-turbo spin echo technique. In comparison with the conventional turbo spin echo sequence, SPACE uses non-selective, long refocusing pulse trains that are made up of RF pulses having variable flip angles. This permits very high turbo factors (measurement time advantage of a turbo SE sequence compared with a conventional spin echo sequence: >100) and a high scanning efficiency. This results in high-resolution isotropic images that allow free reformatting in all planes. In addition, EKG triggering enables angiography with large field of views (FOVs), as is required for example in the context of peripheral angiography of the legs. Nonetheless, FBI and SPACE represent very complicated measurement methods, because a triggering, in particular triggering by breath and EKG, as is required both in FBI and in SPACE, is generally very expensive:

A respiration monitor belt has to be applied, and a number of EKG electrodes must be affixed to the body. The sequence supplies only data that fit a corresponding cardiorespiratory rhythm and the respiratory and heartbeat measurement devices have to be combined and configured in terms of measurement technology with the MRT measurement system (installation computer, sequence controlling).

SUMMARY OF THE INVENTION

An object of the present invention is to provide an MRT measurement method that permits the representation of vessels without the use of contrast agent and without physiological synchronization with the execution of the sequence.

According to the present invention, this object is achieved by a method is proposed for contrast-agent-free, non-triggered angiographic imaging in magnetic resonance tomography, having the following steps:

S1: 2D or 3D measurement of a bodily region having a blood flow, using a flow-insensitive SSFP sequence;

S2: measurement of the same bodily region using a flow-sensitive SSFP sequence;

S3: registration to one another of the measurement results obtained in steps S1 and S2;

S4: unweighted or self-weighted subtraction of the registered measurement result obtained in step S2 from the registered measurement result obtained in step S5: execution of a 2D or 3D image correction of the image obtained in step S4 for removing image distortions caused by gradient field inhomogeneities and/or magnetic basic field inhomogeneities; and S6: representation of the angiogram obtained in step S5 in the form of an MIP or segmented 2D or 3D vessel tree representation.

It is advantageous for the flow-insensitive SSFP sequence to be a trueFISP sequence or a phase-cycled SSFP sequence, e.g. a CISS sequence, and the flow-sensitive SSFP sequence represents a FISP sequence.

It is also advantageous for the SSFP sequences that are to be implemented, to use the optimal flip angle α that maximizes the respective SSFP signal, and for all geometric MRT parameters—of both the flow-sensitive and the flow-insensitive SSFP sequences—to be identical.

A self-weighted subtraction can be implemented in step S4 takes place according to the following mathematical equation:

$$MRA = T - \lambda \cdot \left(\frac{F}{T_{max}}\right)^K \cdot F,$$

where T is the trueFISP or CISS signal, F is the FISP signal, and λ and K are parameters that are to be determined by the user.

In addition, it is advantageous to vary the flow-sensitive SSFP sequence through the application of a matched spoiler gradient in the readout direction and/or in the slice selection direction at time TR. It is also advantageous for the variation to take place in such a way that the first moment M1 is not compensated.

BRIEF DESCRIPTION OF THE DRAWINGS

FIG. 9 shows image examples of the method according to the present invention.

DESCRIPTION OF THE PREFERRED EMBODIMENTS

Figure 1:
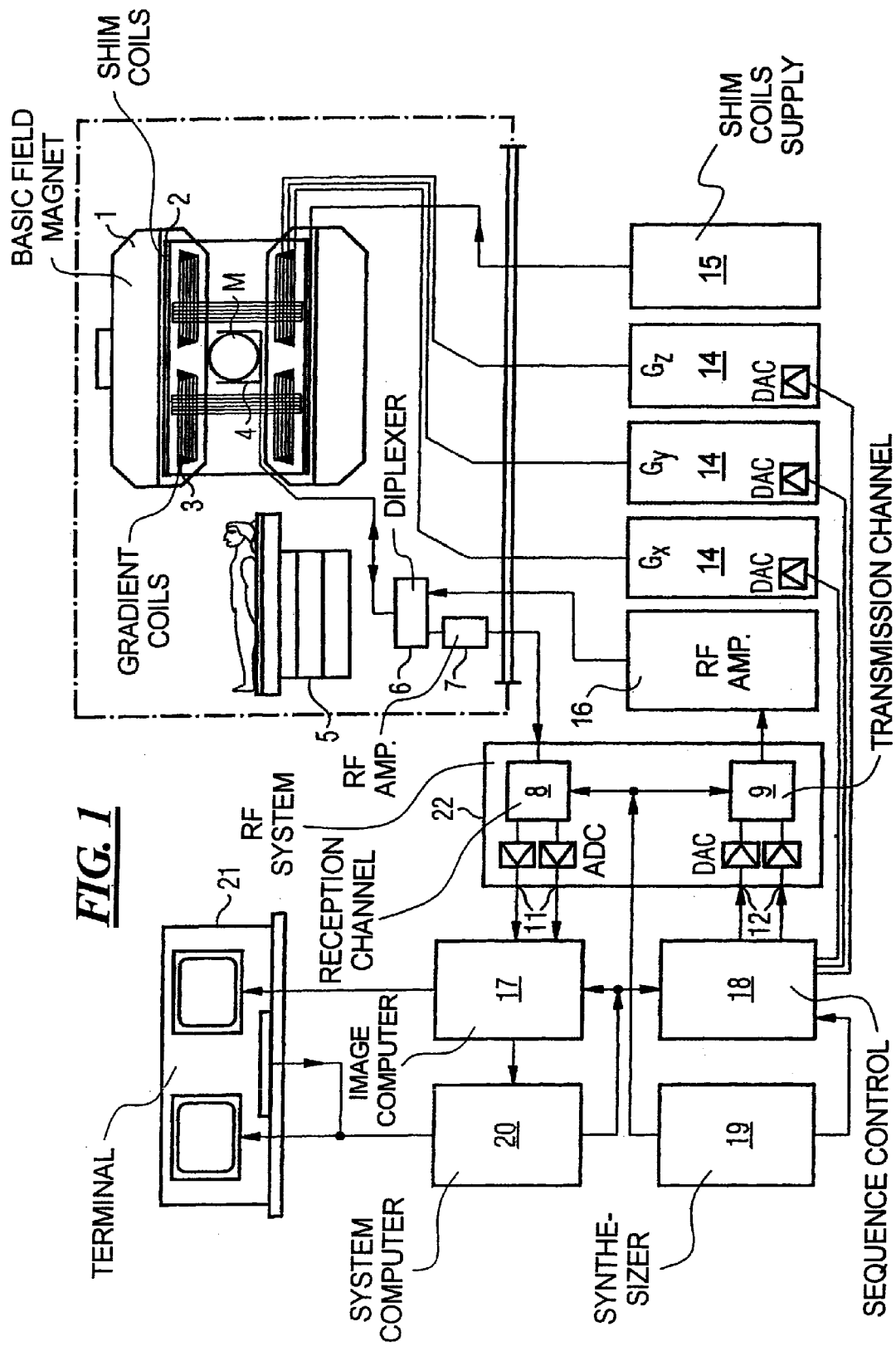
FIG. 1 schematically shows a conventional nuclear spin tomography device that is suitable for executing the method according to the present invention.
Figure 2:
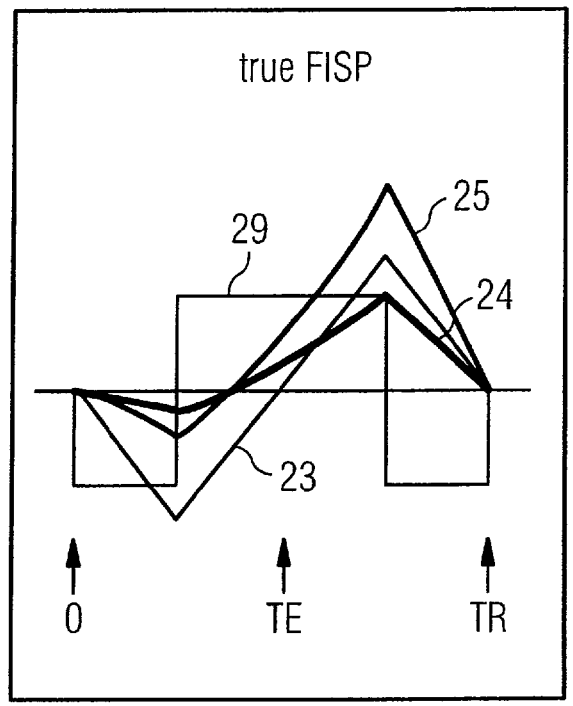
FIG. 2 shows the phase curve for stationary and flowing spins in a trueFISP sequence.

FIG. 1 schematically shows a magnetic resonance tomography device for producing a magnetic resonance image of a subject according to the present invention. The basic design of the tomography device corresponds to the design of a conventional tomography device, with differences noted below. A basic field magnet 1 produces a strong magnetic field that is constant over time for the polarization or orientation of the nuclear spins in the examination region of a subject, such as a part of a human body that is to be examined. The high degree of homogeneity of the basic magnetic field required for a magnetic resonance measurement is defined in a spherical measurement volume M into which the parts of the human body that are to be examined are brought. In order to support the homogeneity requirements, and in particular in order to eliminate chronologically invariable influences, shim plates made of a ferromagnetic material are attached at a suitable location. Temporary variable influences are eliminated by shim coils 2 that are driven by a shim power supply 15.

In basic field magnet 1, a cylindrical gradient coil system 3 is used that is composed of three partial windings. Each partial winding is supplied by an amplifier 14 with current in order to produce a linear gradient field in the respective direction of the Cartesian coordinate system. The first partial winding of gradient field system 3 produces a gradient $G_x$ in the x direction, the second partial winding produces a gradient $G_y$ in the y direction, and the third partial winding produces a gradient $G_z$ in the z direction. Each amplifier 14 has a digital-analog converter that is driven by a sequence control unit 18 for the production of gradient pulses at the correct time.

Within gradient field system 3, there is situated a radio-frequency antenna 4 that converts the radio-frequency pulses emitted by a radio-frequency power amplifier 30 into a magnetic alternating field in order to excite the nuclei and orient the nuclear spins of the subject being examined, or of the region of the subject that is being examined. Radio-frequency antenna 4 also converts the alternating field emanating from the precessing nuclear spins, i.e., as a rule, the nuclear spin echo signals caused by a pulse sequence of one or more radio-frequency pulses and one or more gradient pulses, into a voltage that is supplied to a radio-frequency receive channel 8 of a radio-frequency system 23 via an amplifier 7. Radio-frequency system 22 further has a transmit channel 9 in which the radio-frequency pulses are produced for the excitation of the magnetic nuclear resonance. The respective radio-frequency pulses are represented digitally in sequence control unit 18 as a sequence of complex numbers, on the basis of a pulse sequence prespecified by installation computer 20. This sequence of numbers is supplied, as a real and as an imaginary portion, to a digital-analog converter in radio-frequency system 22, via a respective input 12, and is supplied by radio-frequency system 22 to a transmit channel 9. In transmit channel 9, the pulse sequences are modulated onto a radio-frequency carrier signal whose base frequency corresponds to the resonant frequency of the nuclear spins in the measurement volume.

The changeover between transmit and receive operation takes place via a transmit/receive duplexer 6. Radio-frequency antenna 4 radiates the radio-frequency pulses for the excitation of the nuclear spins into measurement volume M, and scans resulting echo signals. The correspondingly obtained magnetic resonance signals are demodulated in phase-sensitive manner in receive channel 8 of radio-frequency system 22, and are converted into the real part and the imaginary part of the measurement signal via a respective analog-digital converter. An image computer 17 reconstructs an image from the measurement data obtained in this way. The management of the measurement data, the image data, and the control programs takes place in an installation computer 20. On the basis of a specification with control programs, sequence control unit 18 monitors the production of the particular pulse sequences that are desired and the corresponding scanning of the k-space. In particular, sequence control unit 18 controls the switching at the correct time of the gradients, the sending out of the radio-frequency pulses with defined phase and amplitude, and the reception of the nuclear resonance signals. The time basis for radio-frequency system 22 and sequence control unit 18 is made available by a synthesizer 19. The selection of corresponding control programs for producing a nuclear spin image, as well as the representation of the produced nuclear spin image, takes place via a terminal 21 that comprises a keyboard and one or more display screens.

According to the present invention, the tomography device is operated with two SSFP sequences that follow one another in succession. These are generated by sequence control unit 18. The implementation of the method according to the present invention takes place in image computer 17, or installation computer 20.

The present invention takes advantage of the fact that different SSFP (Steady-State Free Precession) sequences are sensitive in different ways to stationary and to flowing spins. Thus, for example a trueFISP sequence (T) is represented as completely movement-compensated, while a pure FISP sequence (F) is highly sensitive to movement. The cause of this is the rephasing, i.e. the phase curve at the time of repetition time TR, as is explained below on the basis of FIGS. 2 through 6.

In magnetic resonance tomography (MRT), the subject is exposed to a strong, constant magnetic field. This causes the nuclear spins of the atoms in the subject, which were previously oriented randomly, to become aligned. Radio-frequency energy can now excite these "ordered" nuclear spins to a particular oscillation. This oscillation produces in the MRT the actual measurement signal, which is recorded using suitable receive coils. Through the use of inhomogenous magnetic fields, produced by gradient coils, the measurement subject can be spatially coded in all three spatial directions in the particular region that is of interest (also called the field of view, or FOV); in general, this is known as spatial coding.

The recording of the data in the MRT takes place in k-space (frequency space). The MRT image in the image space is linked to the MRT data in k-space using Fourier transformation. The spatial coding of the subject, which spans k-space, takes place using gradients in all three spatial directions. Here, a distinction is made between slice selection (which defines an exposure slice in the subject, standardly the z axis), frequency coding (which defines a direction in the slice, standardly the x axis), and phase coding (which determines the second dimension within the slice, standardly the y axis).

Thus, at first a slice is selectively excited, for example in the z direction. The coding of the locus information in the slice takes place using a combined phase coding and frequency coding, using these two already-mentioned orthogonal gradient fields, which in the example of a slice excited in the z direction are produced by the also already-named gradient coils in the x and y direction.

Figure 4:
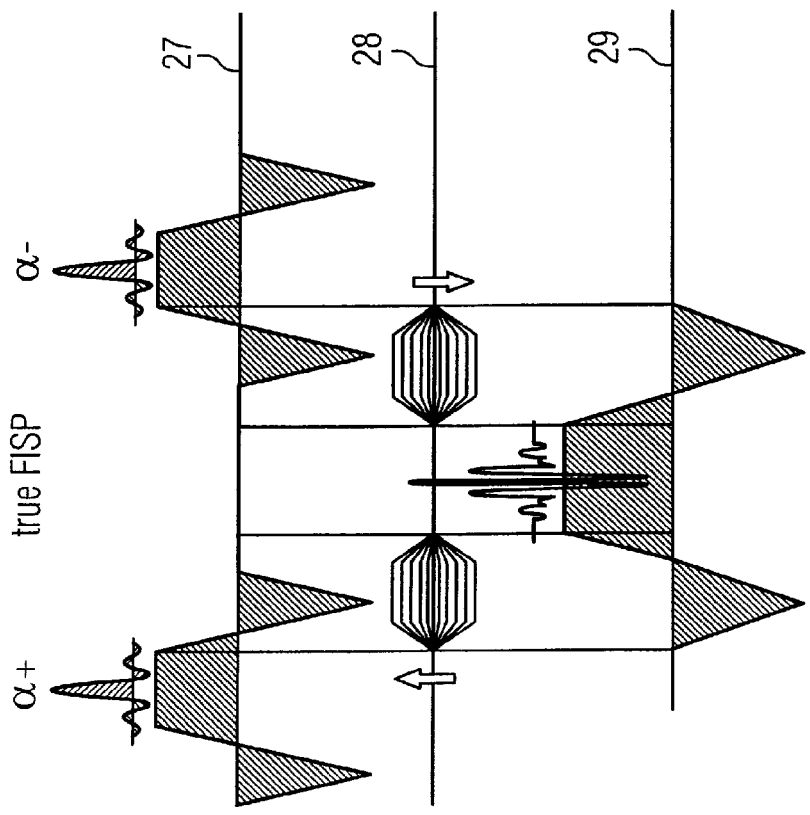
FIG. 4 shows the typical sequence curve of a trueFISP sequence.

A possible form for recording the data in an MRT experiment is based on what is called the trueFISP sequence, shown in FIG. 4. "FISP" stands for "Fast Imaging with Steady Precession," and is the special form of a gradient echo sequence.

As in the conventional imaging sequences, here as well a rephasing takes place with regard to a slice selection gradient $G_s$ 27, and a pre-dephasing takes place with regard to a readout gradient $G_R$ 29. Through this gradient switching, the dephasing, caused by the gradients, of the cross-magnetization is compensated, so that an echo signal results that is called a gradient echo. The basic idea is thus that the transversal magnetization is restored after the reading out of the signal, and can be used for the next sequence pass.

The echo signal is generated exclusively through gradient reversal.

The repetition time TR is the time after which one RF excitation pulse follows the other. After time $T_E=(T_R/2)$, the echo signal takes place and can be acquired using readout gradient $G_R$ 29.

The trueFISP signal is distinguished by a complete symmetry in the time domain; i.e., gradient trains 27, 28, 29 are completely balanced $$\left(\sum_i G_i \cdot t_i = 0\right).$$

Due to the complete symmetry of the gradient trains in the time domain, all magnetization portions are again refocused, so that after a short setting time the ideal steady-state signal arises.

During the phase coding, before the acquisition of the steady-state signal and after the acquisition for a fixed time, a gradient field 28 is switched on whose strength is decreased (↓) or increased (↑) step-by-step by the amount $\Delta G_p$.

Figure 5:
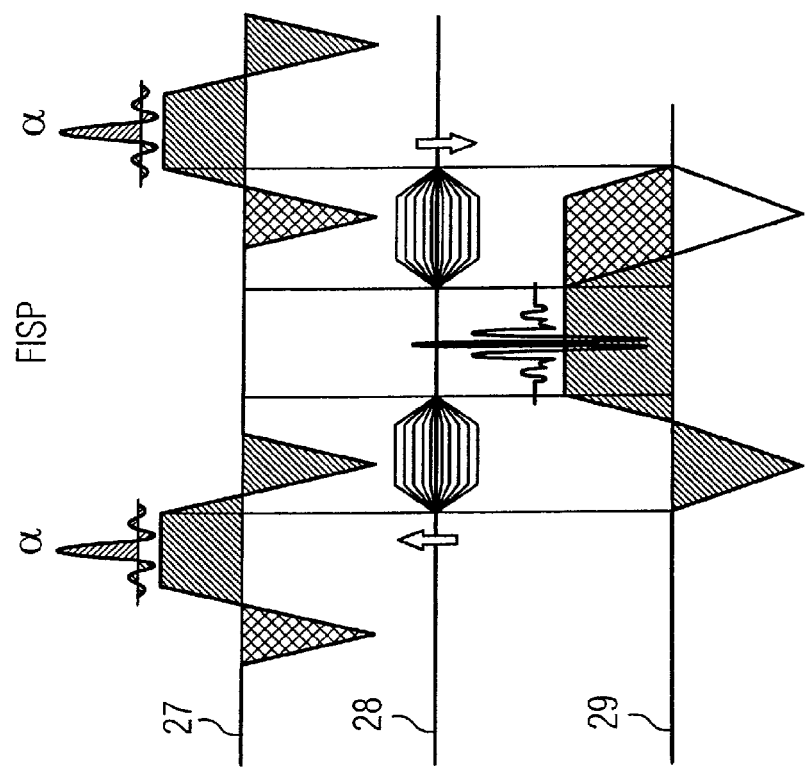
FIG. 5 shows a possible variant of the sequence curve of a FISP sequence.

Due to its complete symmetry in the time domain, the trueFISP sequence is a special form of the more general FISP sequence. The pulse and gradient sequence of a FISP sequence is shown schematically in FIG. 5. In order to bring about the most highly pronounced movement sensitivity of the FISP sequence in the sense of the present invention, the (gradient) symmetry must be destroyed, both in slice selection direction 27 and in readout direction 29. In FIG. 5, this is achieved by omitting the first pre-dephasing pulses, applied before each α-pulse, in the slice selection direction (hatched surfaces); likewise, the post-dephasing pulse in the readout direction is inverted, which causes the readout gradient to be correspondingly lengthened.

As already mentioned, the cause of sensitivity with regard to moving (e.g. flowing) spins can be traced back to the degree of the rephasing, i.e. the phase at the time of repetition time TR. The phase curve given non-flowing, i.e. stationary, spins 23 (v=0) and for spins 24, 25 flowing with different strengths (v≠0) is shown for the trueFISP sequence in FIG. 2, and for a FISP sequence in FIG. 3, in each case in combination with readout gradient 29. The phase curves given spin movement have a slight parabolic shape, while the phase curve for stationary spins is linear. In the case of the trueFISP sequence (FIG. 2), the readout gradient is completely symmetrical (completely balanced; vanishing gradient integral), which has the result that at time TR a complete rephasing takes place for all phase curves. Although the gradient moments at the echo time diverge M1 (TE)≠0, the zeroth-order and first-order gradient moments at repetition time TR are equal to zero: $M_0(Tr)=M_1(Tr)=0$. This means that all the spins are again refocused at TR; i.e., at time TR a maximum SSFP signal that is independent of the spin movement arises. The trueFISP sequence is therefore insensitive to movement.

This is not the case for the FISP sequence. In the case of FISP, the SSFP signal is destroyed by a non-constant phase at time TR.

Figure 3:
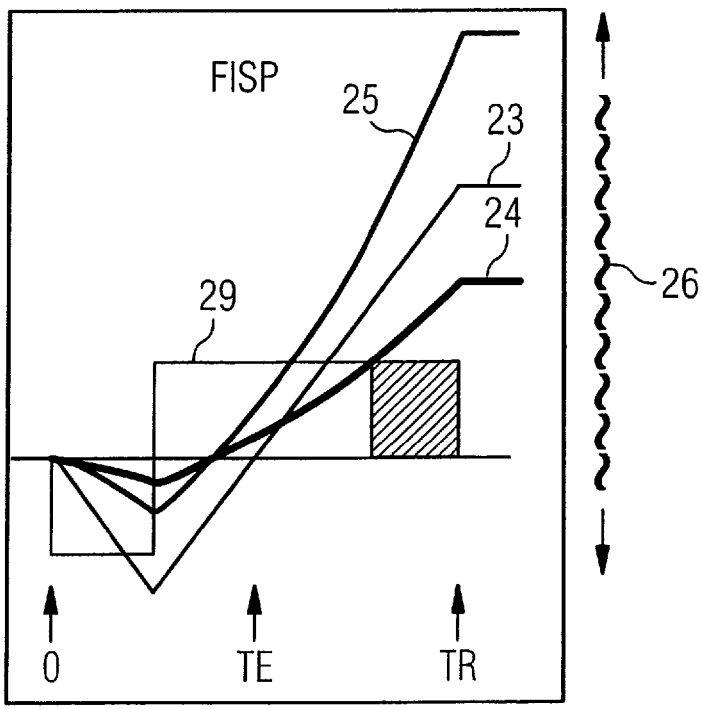
FIG. 3 shows the phase curve for stationary and flowing spins in a FISP sequence.

As FIG. 3 shows, the gradient curve of the FISP sequence is asymmetrical. The positively continuing (hatched) gradient results in a further, still stronger, diversion of phase curves 23, 24, 25 at time TR, causing increasing attenuation up to the complete extinguishing of the SSFP signal. In addition, as a result of the non-uniformity of the spin movement (spin flow), the divergence is time-dependent, resulting in a kind of phase oscillation 26 given non-stationary spin movement, which also counteracts a (SSFP) signal formation. The precise theory of this interaction between an incomplete rephasing at time TR and the strength or attenuation of the SSFP signal that forms is very complex and need not be explained further herein.

Figure 6:
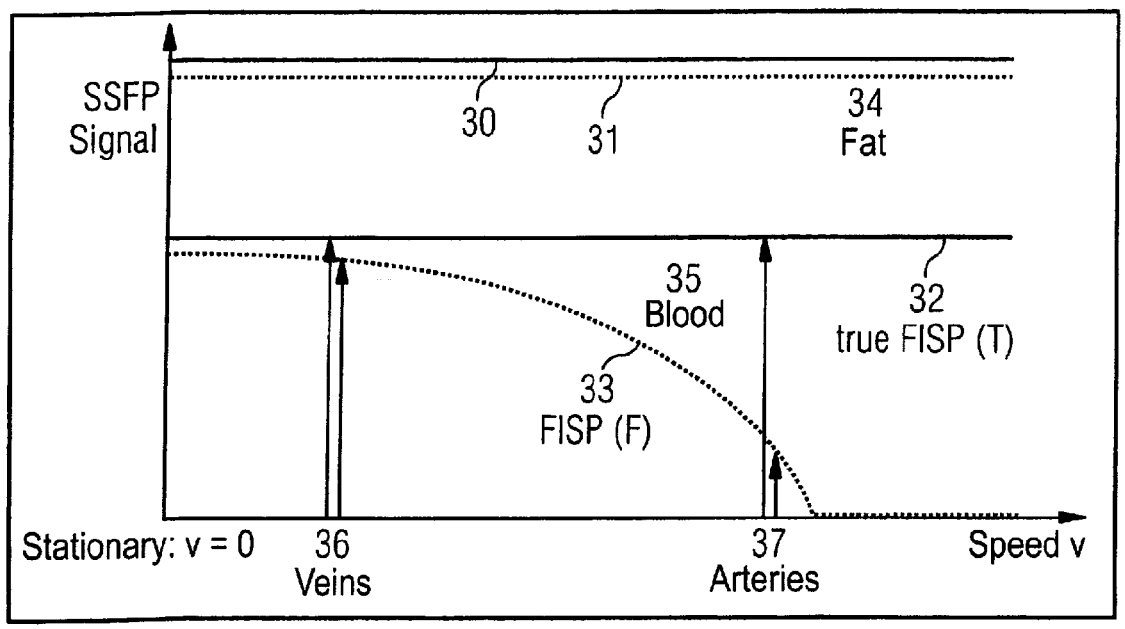
FIG. 6 schematically shows the dependence of the SSFP signal on the spin flow speed for trueFISP and for FISP.

However, for understanding the present invention, the differing dependence of the SSFP signal of a trueFISP sequence or of a simple FISP sequence on the (spin flow) speed, shown in FIG. 6 in highly schematized fashion, is ultimately important. Dotted lines 31, 33 show the FISP signal (F), while solid lines 30, 32 show the trueFISP signal (T).

The SSFP signal of stationary adipose tissue 34 is speed-independent both for FISP 31 and for trueFISP 30. This is not true in the case of flowing blood 35. TrueFISP signal 32 remains speed-independent, while FISP signal 33 falls off towards zero as the flow speed increases. Because in general the flow of blood in veins 36 is not very high, the SSFP signalings differ only very slightly between FISP and trueFISP in veins 36 (see, in FIG. 6, the SSFP arrow lengths at the level of veins 36 on the speed axis).

If, however, in FIG. 6 the signal difference between trueFISP 32 and FISP 33 is regarded in a speed range of an average blood flow speed, such as occurs in arteries 37 (see, in FIG. 6, the SSFP arrow lengths at the level of arteries 37), this is marked by the fact that the difference between an angiographic trueFISP exposure and an angiographic FISP exposure of the same anatomy essentially represents only the arterial system.

Thus, the SSFP signal difference between two differently speed-dependent SSFP sequences (e.g. FISP and trueFISP) represents the basis for the present invention.

Figure 7:
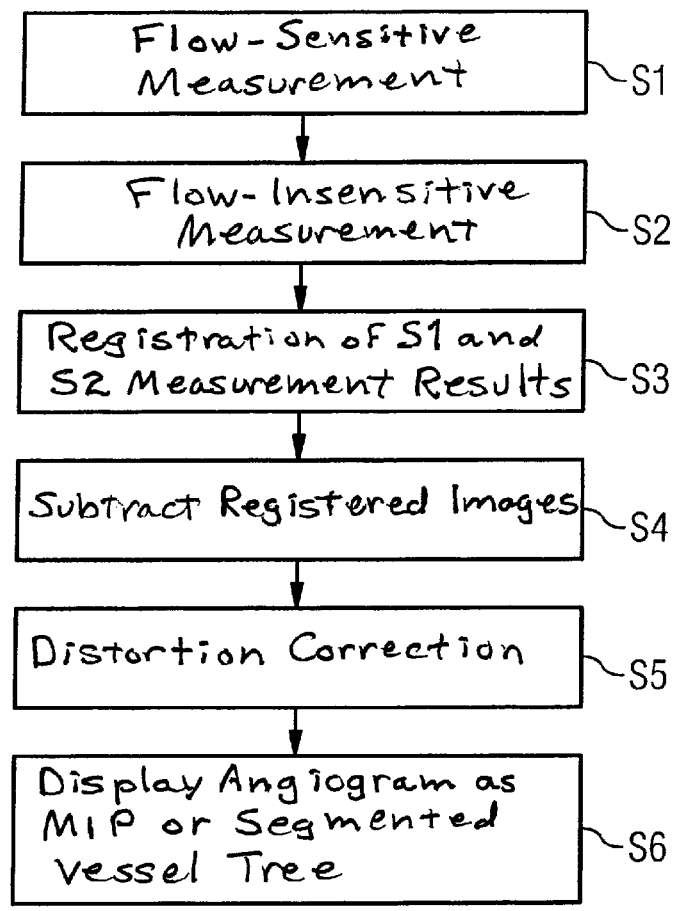
FIG. 7 is a flow diagram of an embodiment of the method according to the present invention.

In the following, the method according to the present invention is explained step-by-step on the basis of FIG. 7.

The decisive factors are the 2D or 3D measurements, which advantageously follow one another in immediate chronological succession in steps S1 and S2, having two different SSFP sequences, as explained above, where the one sequence (in the slice and readout direction) must be movement-compensated and the other sequence must be movement-sensitive (flow-sensitive). It does not matter which of the two sequences is applied first.

The immediacy of the chronological succession is advantageous in order to keep movement-caused differences and/or artifacts due to patient movement, heart movement, breathing, peristalsis, etc., as small as possible. However, differences due to movement in the two exposures cannot be completely avoided. In order nonetheless to be able to make a meaningful comparison of the two images with one another in the sense of high-resolution angiography, in a third step S3 the measurement results obtained in steps S1 and S2 must be registered to one another. In a fourth step S4, the 2D or 3D images registered to one another are subtracted from one another, either without weighting or with self-weighting, and in this way an ideally background-free image of the arteries is obtained.

Here, "self-weighting" means that the subtraction carried out in step S4 takes place according to the following mathematical equation:

$$MRA = T - \lambda \left( \frac{F}{T_{max}} \right)^{\kappa} \cdot F,$$

where T is the movement-compensated signal (e.g. trueFISP), F is the movement-sensitive signal (FISP), and A and K represent parameters that are to be determined by the user. A simple, or also self-weighted, subtraction can in principle provide a differential representation of arterial and venous blood vessels, because the low flow speed in the veins also causes a signal, even though it is a small one, which can be amplified. The image subtraction can be made more free of noise by using a self-weighted subtraction.

In particular for large FOVs, both gradient field inhomogeneities and magnetic basic field inhomogeneities may be expressed as image distortions of the image obtained in step S4; such distortions can be more or less strong, but in general are not to be ignored. These can be eliminated in a fifth step S5, using known reliable correction methods (distortion correction methods). Finally, in a sixth and final step S6 the angiogram obtained in step S5 is displayed for example on the image computer in the form of an MIP (maximum intensity projection) or a segmented 2D or 3D vessel tree.

Such a representation of the vessels from the cervical spine region is shown in the upper part of FIG. 9. The lower part of FIG. 9 shows the arteries, having a strong signal, in comparison to the veins, which have a weak signal but are nonetheless visible, in the area of the fossa poplitea.

The problem of larger areas that are to be imaged was mentioned above. For example, for representing the vessels of the extremities, which requires a large FOV, there is a high probability that what are known as off-resonance artifacts of the trueFISP sequence will appear. These can be reduced through the application of other movement-compensated SSFP imaging sequences, namely phase-cycled SSFP schemata such as the CISS sequence. Phase-cycled steady-state sequences are trueFISP measurements having different RF excitation pulse schemata, which in general also yield different data sets. The immediate sequence of a number of phase-cyclical steady-state sequences is designated a CISS sequence (Constructive Interference in Steady-State). It is currently used for high-resolution $T_2$ imaging, by means of which in particular liquids can be measured with a very high intensity due to the advantageous small $T_1/T_2$ ratio.

However, when using phase-cycled SSFP schemata (CISS would for example be ideal), the measurement time, which can be up to twice as long, must also be accepted. Furthermore, all geometric MR parameters (e.g. spatial resolution, bandwidth, etc.) of the two sequences used in steps S1 and S2 should preferably be identical.

Figure 8:
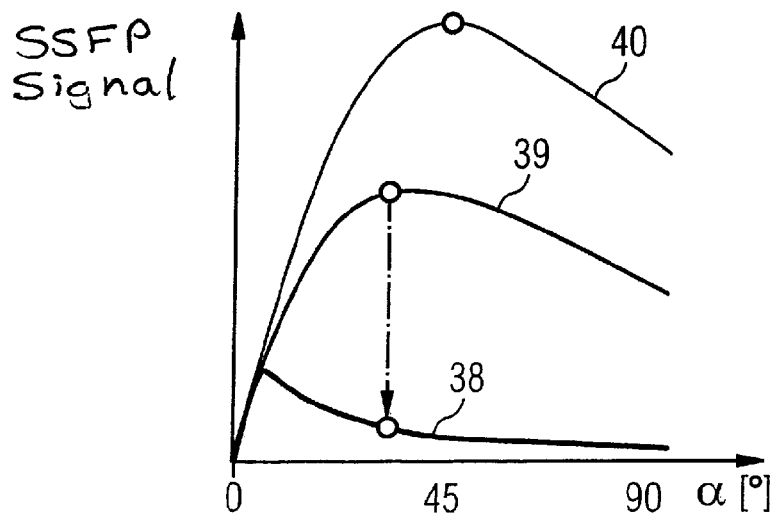
FIG. 8 shows the signal behavior of various SSFP sequences as a function of the flip angle.

The contrast parameters, such as the flip angle $\alpha$, should be selected such that in the movement-compensated image (e.g. in the trueFISP image, the T image) blood has the maximum intensity, but in the movement-sensitive F image musculature and adipose tissue also have maximum intensity. The signal behavior of SSFP sequences as a function of the flip angle $\alpha$ in order to seek the respectively optimal flip angle in the T image, as well as in adipose and muscle tissue, is shown in FIG. 8.

In addition, the respective echo times TE of the two sequences should also be approximately equal, in particular in order to reduce opposed effects as well as possible.

The FISP contrast (the contrast of the 2D or 3D image obtained through FISP) can also vary within certain limits through partial RF spoiling: through individually matched gradient spoilers, as they are called, the movement sensitivity of the FISP sequence can be amplified or reduced in a targeted manner, thus for example through "spoiling" exclusively in the slice selection direction and/or in the readout direction, or else through complete balancing (symmetrical spoiling) in the readout direction or in the slice selection direction.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for contrast agent-free, non-triggered angiographic imaging in magnetic resonance tomography, comprising the steps of:
   (S1) operating a magnetic resonance tomography apparatus to acquire a dataset, selected from the group consisting of a two-dimensional (2D) dataset and a three-dimensional (3D) dataset, of magnetic resonance data from a body region of an examination subject having blood flowing therein, using a flow-insensitive steady state free precession (SSFP) magnetic resonance data acquisition sequence selected from the group consisting of trueFISP (wherein FISP is a fast imaging with steady state precession sequence), and phase-cycled SSFP sequences;
   (S2) acquiring a dataset, selected from the group consisting of a 2D dataset and a 3D dataset, of magnetic resonance data from said body region using a FISP sequence as a flow-sensitive SSFP sequence;
   (S3) bringing said dataset acquired in (S1) into registration with the dataset acquired in (S2), thereby obtaining a registered dataset from (S1) and a registered dataset from (S2);
   (S4) subtracting said registered dataset from (S2) from the registered dataset from (S1) by unweighted or self-weighted subtraction;
   (S5) subjecting a dataset resulting from the subtraction in (S4) to image correction by removing image distortions caused by gradient field inhomogeneities or basic magnetic field inhomogeneities, to obtain a corrected dataset; and
   (S6) generating an angiographic image from the corrected dataset from (S5) in a representation selected from the group consisting of a maximum intensity projection (MIP) and a segmented vessel tree.

2. A method as claimed in claim 1 comprising employing a constructive interference steady state (CISS) sequence as said flow-insensitive SSFP magnetic resonance data acquisition sequence.

3. A method as claimed in claim 1 comprising, in each of said flow-insensitive SSFP sequence and said flow-sensitive SSFP sequence, radiating radio frequency pulses with a flip angle that maximizes a resulting SSFP signal.

4. A method as claimed in claim 1 comprising using identical geometric magnetic resonance tomography parameters in each of said flow-sensitive SSFP sequence and said flow-insensitive SSFP sequence.

5. A method as claimed in claim 1 comprising varying said flow-sensitive SSFP sequence in a direction selected from the group consisting of the readout direction and the slice-selection direction, by generating a matched spoiler gradient in said direction upon each repetition of said flow-sensitive SSFP sequence.

* * * * *